United States Patent
Cheng et al.

(10) Patent No.: US 11,870,450 B1
(45) Date of Patent: Jan. 9, 2024

(54) JITTER AND REFERENCE SPUR MANAGEMENT WITH ADAPTIVE GAIN BY VOLTAGE CONTROLLED OSCILLATOR CALIBRATION

(71) Applicant: Ambarella International LP, Santa Clara, CA (US)

(72) Inventors: Yueh Chun Cheng, Cupertino, CA (US); Xuan Wang, San Jose, CA (US)

(73) Assignee: Ambarella International LP, Santa Clara, CA (US)

( * ) Notice: Subject to any disclaimer, the term of this patent is extended or adjusted under 35 U.S.C. 154(b) by 0 days.

(21) Appl. No.: 17/683,613

(22) Filed: Mar. 1, 2022

(51) Int. Cl.
 *H03L 7/06* (2006.01)
 *H03L 7/099* (2006.01)
 *H03L 7/089* (2006.01)

(52) U.S. Cl.
 CPC .......... *H03L 7/0992* (2013.01); *H03L 7/0893* (2013.01); *H03L 7/0995* (2013.01); *H03L 2207/06* (2013.01)

(58) Field of Classification Search
 CPC ..... H03L 7/06; H03L 7/10; H03L 7/16; H03L 7/18; H03L 7/181; H03L 7/24; H03L 7/099; H03L 7/0995
 USPC .......................................................... 375/376
 See application file for complete search history.

(56) References Cited

U.S. PATENT DOCUMENTS 7,590,387 B2 * 9/2009 Chien ................. H03L 7/099
 455/67.11
8,049,540 B2 * 11/2011 Shanan ................. H03L 7/0893
 327/148

\* cited by examiner

*Primary Examiner* — Hai L Nguyen
(74) *Attorney, Agent, or Firm* — Christopher P. Maiorana, PC

(57) ABSTRACT

An apparatus comprises a first circuit and a second circuit. The first circuit may be configured to generate an output signal having a first frequency in response to a voltage level of a first input signal and a value of a second input signal. The second circuit may be configured to determine the value of the second input signal based on a reference frequency signal, the first frequency of the output signal, a reference voltage, and a value representing a target frequency for the output signal.

20 Claims, 10 Drawing Sheets

US 11,870,450 B1

JITTER AND REFERENCE SPUR MANAGEMENT WITH ADAPTIVE GAIN BY VOLTAGE CONTROLLED OSCILLATOR CALIBRATION

FIELD OF THE INVENTION

The invention relates to integrated circuits generally and, more particularly, to a method and/or apparatus for implementing jitter and reference spur management with adaptive gain by voltage controlled oscillator calibration.

BACKGROUND

Phase-locked loops (PLLs) are used to generate clock signals that control many operations in integrated circuits. In many applications, the PLLs need to cover a wide range of frequencies. For example, an operating frequency of a double data rate (DDR) memory device can range from 4 GHz to 8 GHz.

In order to cover the wide range of frequencies and account for variations due to process, voltage, and temperature (PVT), a voltage controlled oscillator (VCO) of the PLLs needs a large VCO gain (Kvco) and a large control voltage range. Large Kvco can result in large jitter. A control voltage that is too low or too high can increase charge pump up and down current mismatch. Charge pump up and down current mismatch can result in reference spurs.

It would be desirable to implement jitter and reference spur management with adaptive gain by voltage controlled oscillator calibration.

SUMMARY

The invention concerns an apparatus comprises a first circuit and a second circuit. The first circuit may be configured to generate an output signal having a first frequency in response to a voltage level of a first input signal and a value of a second input signal. The second circuit may be configured to determine the value of the second input signal based on a reference frequency signal, the first frequency of the output signal, a reference voltage, and a value representing a target frequency for the output signal.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing jitter and reference spur management with adaptive gain by voltage controlled oscillator (VCO) calibration that may (i) utilize a flexible current ratio to reduce VCO gain (Kvco) over process, voltage, and temperature (PVT), (ii) reduce jitter, (iii) use a reference voltage (e.g., half of a supply voltage of a charge pump driving the VCO) to calibrate a control voltage of the VCO, (iv) minimize reference spurs, (vi) avoid external current source circuits, (vii) compensate for frequency variation due to temperature without needing a temperature sensor, (viii) avoid added device noise, (ix) utilize a low drop out regulator to filter out supply noise, (x) compensate for PVT variation, and/or (xi) be implemented as one or more integrated circuits.

Phase-locked loops (PLLs) are important building blocks for communication and data processing systems. In many applications, PLLs are implemented with wide tuning ranges in order to cover desired operating frequency bands and to accommodate process, voltage, and temperature (PVT) variations. As the operating frequencies of PLLs increase and supply voltages scale down with advanced complementary metal-oxide-semiconductor (CMOS) technologies, the voltage-controlled oscillator (VCO) tuning gain (Kvco, expressed in GHz/V) increases considerably. A large Kvco may degrade PLL phase noise and spur performance severely.

In various embodiments, the disadvantages of the large VCO gain may be addressed by employing multiple overlapped tuning sub-bands to cover the desired frequency range, instead of using just a single tuning curve. The VCO topology employing multiple overlapped tuning sub-bands may achieve low VCO gain while still covering a wide frequency tuning range. A VCO calibration circuit is generally implemented to select an optimum frequency sub-band that covers the desired operating frequency. In various embodiments, a ring VCO design may be implemented utilizing VCO calibration with a flexible ratio IDAC current, which may significantly improve the PLL phase noise and spur performance. The ring VCO design generally includes a low drop out regulator (LDO) to remove supply noise.

Figure 1:
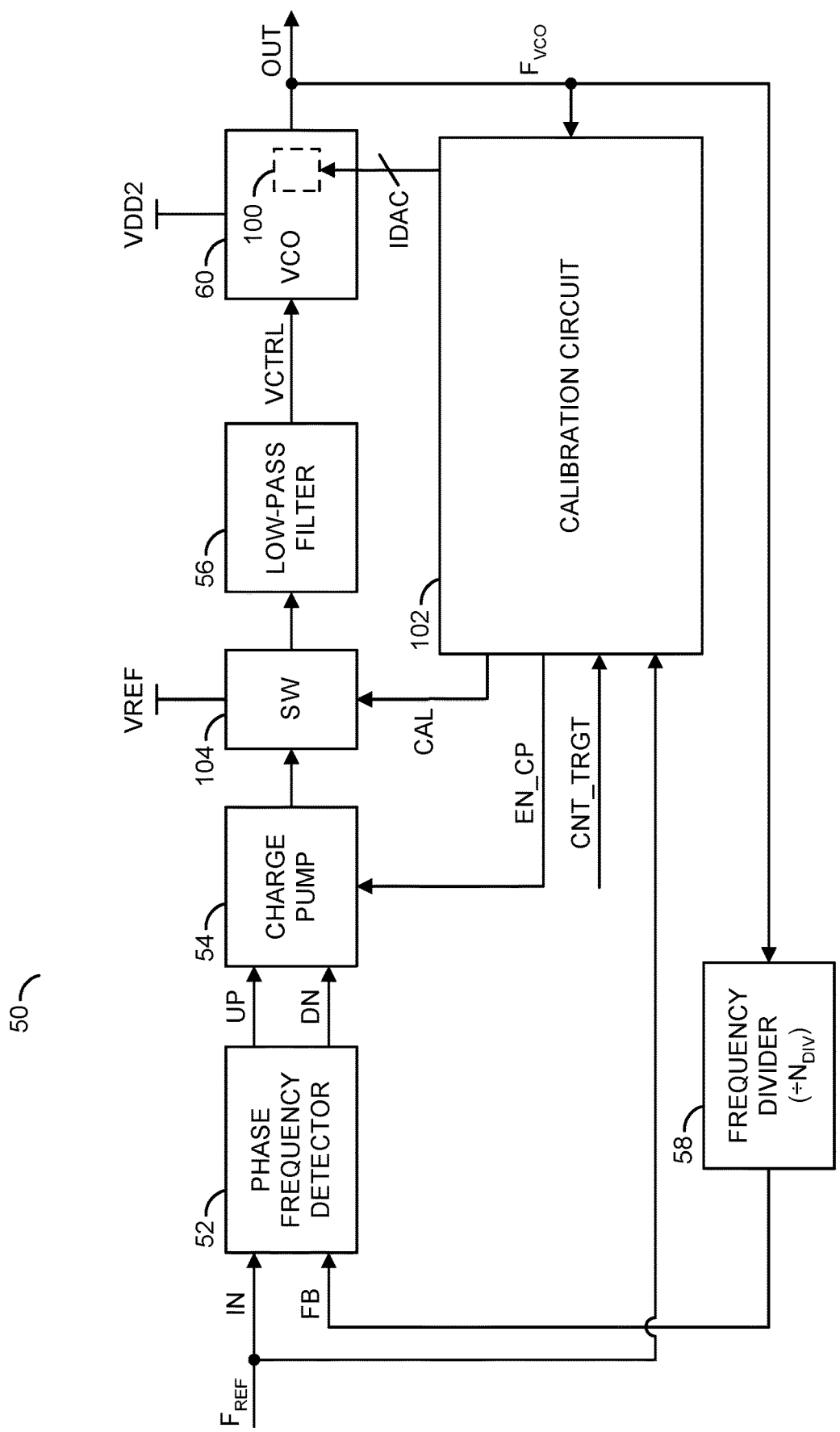
FIG. 1 is a diagram illustrating a phased locked loop circuit in accordance with an embodiment of the invention.

Referring to FIG. 1, a diagram is shown illustrating a phase-locked loop circuit in accordance with an embodiment of the invention. In an example, a circuit 50 may implement a phase-locked loop (PLL) circuit in accordance with an embodiment of the invention. In an example, the circuit 50 may be utilized to implement a frequency synthesizer (or generator) circuit. In an example, the circuit 50 may have an input that may receive an input signal (e.g., IN), and an output that may present an output signal (e.g., OUT). In an example, the input signal IN may comprise a first (or reference) frequency (e.g., $F_{REF}$) and the output signal OUT may comprise a second (or VCO) frequency (e.g., $F_{VCO}$).

In an example, the reference frequency may be derived from a precision frequency source such as a crystal (XTAL) oscillator. In an example, the crystal oscillator may be external to an integrated circuit embodying the circuit 50. In an example, a clock signal from the crystal oscillator may be applied to a pin of the integrated circuit and communicated to the input of the circuit 50. In another example, the clock signal from the crystal oscillator may be presented to an input of a pre-scaler circuit (not shown). The pre-scaler circuit may be configured to divide a frequency of the crystal (or external) oscillator to a desired input frequency $F_{REF}$ of the circuit 50. In an example, the pre-scaler circuit may be programmable to allow operation of the circuit 50 with a variety of source clock frequencies.

In an example, the circuit 50 may be configured to generate the frequency $F_{VCO}$ of the output signal OUT as a multiple (e.g., either integer or fraction) of the frequency $F_{REF}$ of the input signal IN (e.g., $F_{VCO}=N \times F_{REF}$). In various embodiments, the frequency and/or phase of the output signal OUT may be locked to the frequency and/or phase of the input signal IN. In an example, one or more clock signals of the integrated circuit may be derived from the signal OUT. In an example, the signal OUT may be presented to an input of a post-scaler circuit (not shown). The post-scaler circuit may be configured to generate the one or more clock signals by dividing the frequency $F_{VCO}$ of the signal OUT to obtain respective clock frequencies of the one or more clock signals. In an example, the post-scaler circuit may be programmable to allow operation of the circuit 50 in a variety of applications.

In an example, the circuit 50 may comprise a block (or circuit) 52, a block (or circuit) 54, a block (or circuit) 56, a block (or circuit) 58, a block (or circuit) 60, a block (or circuit) 100, a block (or circuit) 102, and a block (or circuit) 104. In an example, the block 52 may be implemented as a phase frequency detector (PFD) circuit. In another example, the block 52 may be implemented as a phase detector (PD) circuit. The block 54 may be implemented as a charge pump (CP) circuit. The block 56 may be implemented as a loop filter. In an example, the block 56 may be implemented as a low-pass filter. The block 58 may be implemented as a frequency divider. In an example, the block 58 may be implemented as an integer-N architecture divider. In another example, the block 58 may be implemented as a fractional-N architecture divider. The blocks 52, 54, 56, and 58 may be implemented using conventional techniques.

In various embodiments, the block 60 may be implemented as a voltage-controlled oscillator (VCO). In various embodiments, the block 60 may be implemented as a ring VCO. In various embodiments, the block 60 may include the block 100. In various embodiments, the block 100 may be configured to implement a ring VCO utilizing a technique of jitter and reference spur management with adaptive gain by voltage controlled oscillator (VCO) calibration in accordance with an embodiment of the invention. The block 102 may implement a calibration circuit. The block 104 may implement a switch circuit.

In an example, the block 52 is illustrated implementing a phase frequency detector (PFD). The PFD 52 may have a first input that may receive the signal IN, a second input that may receive a signal FB, a first output that may present a signal UP, and a second output that may present a signal DN. The signals UP and DN may implement control signals. The signal FB may be a divided version of the signal OUT. The signal UP, when asserted, may indicate the frequency $F_{VCO}$ of the signal OUT needs to be increased. The signal DN, when asserted, may indicate the frequency $F_{VCO}$ of the signal OUT needs to be decreased. In an example, the PFD 52 may implement an edge sensitive circuit that measures an arrival time of an edge of the signal IN relative to an arrival time of an edge of the signal FB.

In an example, the signal UP may be asserted (e.g., a digital HIGH, or 1) when the edge of the signal IN arrives before the edge of the signal FB. Likewise, the signal DN may be asserted (e.g., a digital HIGH, or 1) when the edge of the signal FB arrives before the edge of the signal IN. In an example, the PFD 52 is generally sensitive to not only a phase difference, but also a frequency difference. When the signal FB is faster than the signal IN (e.g., a frequency $F_{FB}$ of the signal FB is higher than the frequency $F_{REF}$ of the signal IN), edges of the signal FB always arrive earlier than edges of the signal IN, and the signal DN may be asserted to request a decrease in the frequency $F_{VCO}$ of the signal OUT. This functionality generally allows the PFD 52 to function as a frequency detector.

The charge pump 54 is generally driven (controlled) by the PFD 52. In an example, the charge pump 54 may have a first input that may receive the signal UP, a second input that may receive the signal DN, and a third input that may receive a signal (e.g., EN_CP). The signal EN_CP may be configured as an enable signal. In an example, the charge pump 54 may be enabled when the signal EN_CP is asserted (e.g., a digital HIGH, or 1). Likewise, the charge pump 54 may be disabled when the signal EN_CP is de-asserted (e.g., a digital LOW, or 0).

The signals UP and DN may be used to control the charge pump 54 when the charge pump 54 is enabled. In an example, the charge pump 54 may comprise a first current source controlled by the signal UP and a second current source controlled by the signal DN. An output of the charge pump 54 may be coupled to an input of the loop filter 56 via the switch circuit 104. In an example, the first current source may be configured to dump charge into an integrating capacitor of the loop filter 56 in response to the signal UP and the second current source may be configured to remove (sink) current from the integrating capacitor of the loop filter 56 in response to the signals DN. An output of the loop filter 56 may present a signal (e.g., VCTRL) comprising a voltage level related to the charge level of the integrating capacitor. If neither the signal UP nor the signal DN is asserted, the output of the charge pump 54 neither dumps charge into nor removes charge from the integrating capacitor of the loop filter 56, which generally happens in steady state. However, any leakage or mismatch between the up/down currents may cause ripples on the output and, therefore, reference spurs to be generated.

In an example, the loop filter 56 may be implemented as a low pass filter. The loop filter 56 is generally configured to reduce ripples on the output of the charge pump 54 and, therefore, reduce reference spurs that may be generated. The loop filter 56 may have an output that may present the signal VCTRL. The signal VCTRL may implement a control voltage signal. In an example (e.g., an operating mode), the loop filter 56 may generate the signal VCTRL in response to the signal received from the charge pump 54. In another example (e.g., a calibration mode), the loop filter 56 may generate the signal VCTRL in response to a reference voltage signal (e.g., VREF).

In an example, the PFD 52, the charge pump 54, and the loop filter 56 are generally implemented in a first power supply domain having an analog supply voltage (e.g., AVDD) and the block 58 and the calibration circuit 102 may be implemented in a second power supply domain having a digital supply voltage (e.g., DVDD). In various embodiments, the analog supply voltage AVDD and the digital supply voltage DVDD may be different. In an example, the analog supply voltage AVDD may be implemented as 1.2 Volts. In an example, the digital supply voltage DVDD may be implemented as 0.75 Volts. In various embodiments, the reference voltage VREF is generally half of the analog supply voltage AVDD. In embodiments where the analog supply voltage AVDD and the digital supply voltage DVDD are different, the PFD 52 may be configured to level shift the signals IN and FB to the level of the analog supply voltage AVDD.

The block 58 may be implemented as a frequency divider. The block 58 may have an input that may receive the signal OUT and an output that may present the signal FB. In an example, the block 58 may be configured with a divider value (e.g. $N_{DIV}$) corresponding to a desired difference between the frequency $F_{REF}$ of the signal IN and the frequency $F_{VCO}$ of the signal OUT (e.g., $F_{VCO}=F_{REF}*N_{DIV}$). In an example, the block 58 may be programmable to allow operation of the circuit 50 in a variety of applications. In an example, an operating frequency of a double data rate (DDR) memory device may range from 4 GHz to 8 GHz. In an example where the signal IN has a frequency of about 24 MHz, the block 58 may be configured with the divider value $N_{DIV}$ having a range from about 165 to about 334.

The voltage-controlled oscillator (VCO) 60 may have a first input that may receive the signal VCTRL, a second input that may receive a signal (e.g., IDAC), and an output that may present the signal OUT. In various embodiments, the signal IDAC may be implemented as a multi-bit digital control signal (e.g., IDAC<n:0>). In an example, the signal IDAC my be implemented as a 7-bit digital control signal (e.g., IDAC<6:0>). However, other numbers of bits may be implemented to meet design criteria of a particular implementation. In an example, the number of bits may be selected to ensure a sufficient number of overlapped tuning sub-bands to enable a voltage range of the signal VCTRL to compensate for frequency variation due to temperature variation. The VCO 60 is generally configured to generate the signal OUT in response to the signal VCTRL, the signal IDAC, and a supply voltage VDD2. In various embodiments, the supply voltage VDD2 may be implemented as twice the analog supply voltage AVDD.

In various embodiments, the VCO 60 comprises the block 100. The block 100 may be configured to implement a ring VCO circuit utilizing a technique of jitter and reference spur management with adaptive gain by voltage controlled oscillator (VCO) calibration in accordance with an embodiment of the invention. The block 100 is generally configured to generate the signal OUT in response to the signal VCTRL, the signal IDAC, and the supply voltage VDD2. In various embodiments, the frequency $F_{VCO}$ of the signal OUT is generally determined in response to the signal VCTRL and the signal IDAC. In an example, the block 100 may be configured to select a frequency tuning sub-band that covers a desired operating frequency range in response to the signal IDAC. The block 102 may implement a VCO calibration circuit.

In an example, the block 102 may have a first input that may receive the signal IN, a second input that may receive the signal OUT, a third input that may receive a signal (e.g., CNT_TRGT), a first output that may present the signal EN_CP, a second output that may present the signal IDAC, and a third output that may present a signal (e.g., CAL). The signal CAL may be configured to indicate a calibration mode. The signal CNT_TRGT may be configured to communicate a target calibration value. The target calibration value is generally input to select (program) a desired VCO frequency $F_{VCO}$. The block 102 is generally configured to perform a VCO calibration process in accordance with an embodiment of the invention. During VCO calibration, the block 102 is generally configured to break the closed loop structure of the PLL circuit 50 (e.g., by disabling the charge pump 54) and insert the reference voltage VREF as the VCO control voltage VCTRL (e.g., using the switch circuit 104). In various embodiments, the reference voltage VREF is generally half of the analog supply voltage AVDD of the charge pump 54 (e.g., for charge pump current match).

In various embodiments, the block 102 may use a frequency divider and one or more counters to check the frequency $F_{VCO}$ of the signal OUT against the frequency $F_{REF}$ of the signal IN. In an example, the circuit 102 may comprise a divider with a calibration divider value (e.g. $N_{CAL}$). The calibration divider value $N_{CAL}$ may be selected based on counting capabilities of the one or more counters. In embodiments where the frequency $F_{VCO}$ of the signal OUT is within the operating capabilities of the one or more counters, the calibration divider value $N_{CAL}$ may be set to one.

In an example, the circuit 102 may utilize the divider circuit to reduce the frequency $F_{VCO}$ of the signal OUT by the calibration divider value (e.g., $F_{VCO}/N_{CAL}$). The circuit 102 may be configured to calculate a number of cycles of the divided version of the signal OUT occurring in a reference period defined based on the frequency $F_{REF}$ of the signal IN. In an example, the number of cycles counted is compared to the externally set value CNT_TRGT to determine which signal frequency (e.g., $F_{REF}$ or $F_{VCO}/N_{CAL}$) is higher or lower. In an example, the value CNT_TRGT is generally set externally for each new target frequency. If higher resolution is needed for calibration, the frequency $F_{REF}$ of the signal IN may be divided down prior to being presented to the counters, in order to provide more target cycles. In general, the calibration divider value $N_{CAL}$ may be programmable. In an example, $N_{CAL}$ is generally defined by digital implementation constraints and calibration precision. In an example, $N_{CAL}$ may be set to a value less than or equal to four. In an example where $F_{VCO}=8$ GHz, the calibration divider value $N_{CAL}$ may be set to four (e.g., $N_{CAL}=4$). In another example where $F_{VCO}=4$ GHz, the calibration divider value $N_{CAL}$ may be set to two (e.g., $N_{CAL}=2$).

In an example, the block 102 may implement a calibration process that performs a binary search to determine an optimal IDAC value. In an example, the IDAC value may be adjusted until the frequency $F_{VCO}$ of the signal OUT is within a predefined range (or threshold) of a target frequency. After calibration is completed, the block 102 may save the IDAC value (e.g., in a latch, a register, a configuration memory, etc.). The block 102 may switch the PLL circuit 50 back to closed loop operation (e.g., by enabling the charge pump 54) so the VCO control voltage VCTRL is approximately half of the regulated supply voltage VDD when the PLL 50 is locked. In an example, the calibration process may be performed at each frequency synthesizer on an integrated circuit implementing an instance of the PLL 50 and at each frequency. Since the calibration process is performed one time for one frequency, when temperature increases or decreases, minor changes in the control voltage VCTRL may be utilized to cover frequency change related to the temperature change.

In an example, the block 104 may be implemented as a pullup switch. In an example, the block 104 may have a first input that may receive the output of the charge pump 54, a second input that may receive the reference voltage VREF, a third input that may receive the signal CAL, and an output that may present a signal to the input of the loop filter 56. In an example, the block 104 may comprise a switch circuit having a first terminal receiving the reference voltage VREF and a second terminal connected to a node formed by a connection of the output of the charge pump 54 and the input of the loop filter 56. The switch may be controlled by the signal CAL. In an example, when the signal CAL is asserted, the switch 104 may tie the node to the reference voltage VREF. When the signal CAL is not asserted, the output of the charge pump 54 may be presented directly to the input of the loop filter 56.

Figure 2:
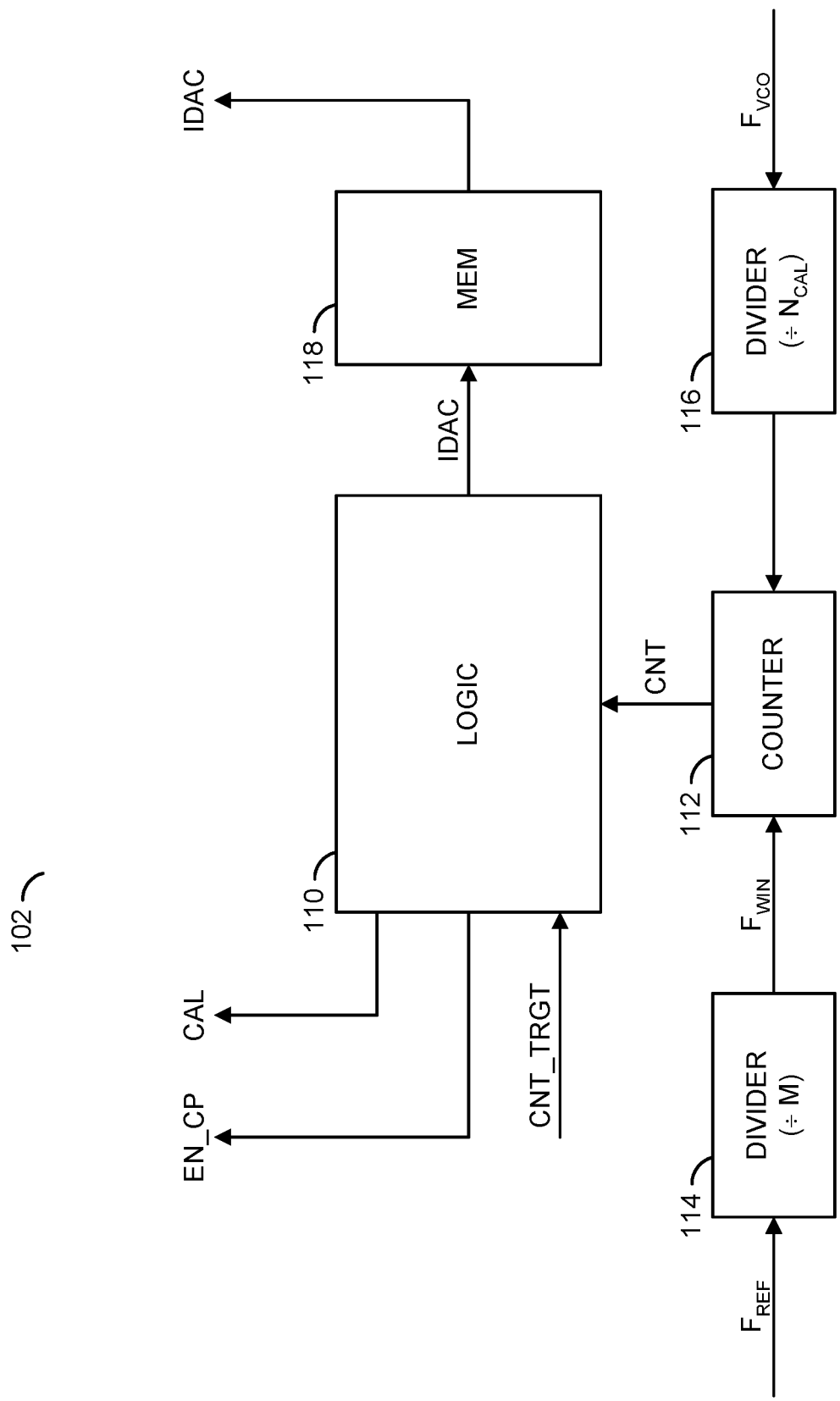
FIG. 2 is a diagram illustrating an example implementation of a calibration circuit in accordance with an embodiment of the invention.

Referring to FIG. 2, a diagram is shown illustrating an example implementation of a calibration circuit in accordance with an example embodiment of the invention. In various embodiments, the block 102 may comprise a block (or circuit) 110, a block (or circuit) 112, a block (or circuit) 114, a block (or circuit) 116, and a block (or circuit) 118. The block 110 may implement a logic circuit. The block 112 may implement a counter circuit. The block 114 may implement a divider circuit. The block 116 may implement a divider circuit. The block 118 may implement a storage circuit (e.g., latch, register, configuration memory, etc.).

In an example, the logic circuit 110 may have a first input that may receive the signal CNT_TRGT, a first output that may present the signal IDAC, a second output that may present the signal CAL, a third output that may present the signal EN_CP, and a second input that may receive a signal (e.g., CNT) from the block 112. The signal CNT generally communicates a count of the number of cycles of the divided version of the signal OUT occurring in a reference period defined based on the frequency $F_{REF}$ of the signal IN. The block 112 may have a first input that may receive the signal (e.g., $F_{WIN}$) from an output of the block 114, a second input that may receive a divided version of the signal OUT from an output of the block 116, and an output that may present the signal CNT to the second input of the block 110.

The block 114 may have an input that may receive the signal IN and an output that may present the signal $F_{WIN}$ to the first input of the block 112. The signal $F_{WIN}$ generally comprises a divided version of the signal IN. The block 114 is generally configured (or programmed) to divide the frequency of the signal IN by a divider value M (e.g., $F_{REF}$÷M) to define the reference period $F_{WIN}$. The divider value M may be set to one (e.g., M=1). If greater calibration precision is needed, the reference period $F_{WIN}$ may be made smaller by setting the divider value M to a value greater than one.

The block 116 may have an input that may receive the signal OUT and an output that may present the divided version of the signal OUT to the second input of the block 112. The block 114 is generally configured (or programmed) to divide the frequency of the signal OUT by the calibration divider value $N_{CAL}$ (e.g., $F_{VCO}$÷$N_{CAL}$). In embodiments where the circuit 102 may operate at the frequency $F_{VCO}$ of the signal OUT, the divider value $N_{CAL}$ may be set to one (e.g., $N_{CAL}$=1). In embodiments where there are constraints on a digital implementation of the circuit 102 and/or a calibration precision, the divider value $N_{CAL}$ may be set to a value greater than one. In an example, $N_{CAL}$ may be set to a value less than or equal to four. In an example where $F_{VCO}$=8 GHz, the calibration divider value $N_{CAL}$ may be set to four (e.g., $N_{CAL}$=4). In another example where $F_{VCO}$=4 GHz, the calibration divider value $N_{CAL}$ may be set to two (e.g., $N_{CAL}$=2).

The block 118 may implement a storage circuit (e.g., latch, register, configuration memory, etc.). The block 118 may have an input that may receive the signal IDAC from the output of the logic circuit 110 and an output that may present the signal IDAC to the second input of the VCO 60. After a calibration process is performed by the calibration circuit 102 to determine an optimum value of the signal IDAC, the value of the signal IDAC may be stored by the circuit 118 for subsequent presentation to the VCO 60.

In an example, the block 102 may perform calibration by counting the number of cycles of the signal $F_{VCO}$÷$N_{CAL}$ that occur in the reference period defined by the signal $F_{REF}$÷M. In an example, the block 112 may be configured to calculate (or accumulate or count) the cycles of the signal $F_{VCO}$÷$N_{CAL}$ that occur in the reference period. The logic circuit 110 is generally configured to compare the number of cycles of the signal $F_{VCO}$÷$N_{CAL}$ that occur in the reference period to the externally set value CNT_TRGT to determine which signal frequency is higher or lower. The logic circuit 110 is generally further configured to perform a binary search for the IDAC value during a number of calibration cycles (or iterations) of the calibration process. In an example, in each calibration cycle one bit of the signal IDAC is updated. In an example, convergence of the IDAC value may be obtained in a number of iterations corresponding to the number of bits in the signal IDAC (e.g., convergence of a 7-bit IDAC value may be obtained in 7 iterations).

In an example, the logic circuit 110 may be configured to control the open and closed loop operation of the circuit 50 and determine the optimum value for the signal IDAC. In an example, the logic circuit 110 may perform the calibration utilizing a binary search process. In an example of a 7-bit IDAC value, the circuit 110 may break closed loop operation of the circuit 50 by de-asserting the signal EN_CP, and set the signal IDAC<6:0> at an initial value of 64. The circuit 110 may also set the control voltage VCTRL of the block 60 to the reference voltage VREF by asserting the signal CAL. In an example, the logic circuit 110 may set the value of the signal IDAC<6:0> to 32 or 96 depending on the result of the comparison of the signals CNT and CNT_TRGT. If, after the change in value of the signal IDAC<6:0> to 32, the counter cycles provided by the signal CNT is less than the target cycles CNT_TRGT, the logic circuit 110 may, for example, change the value of the signal IDAC<6:0> to 48. If, after the change in value of the signal IDAC<6:0> to 32, the counter cycles provided by the signal CNT is greater than the target cycles CNT_TRGT, the logic circuit 110 may, for example, change the value of the signal IDAC<6:0> to 16. If, after the change in value of the signal IDAC<6:0> to 48 or 16, the counter cycles provided by the signal CNT is equivalent to the target cycles CNT_TRGT, the logic circuit 110 may move to the next iteration without changing the value of the signal IDAC<6:0>. When an iteration has been performed for each bit of the signal IDAC<6:0>, the logic circuit 110 may end calibration, enable closed loop operation, and allow the circuit 50 to obtain a locked state. The logic circuit 110 may be configured to perform the calibration process each time a new frequency is requested (e.g., the value CNT_TRGT is changed).

Figure 3:
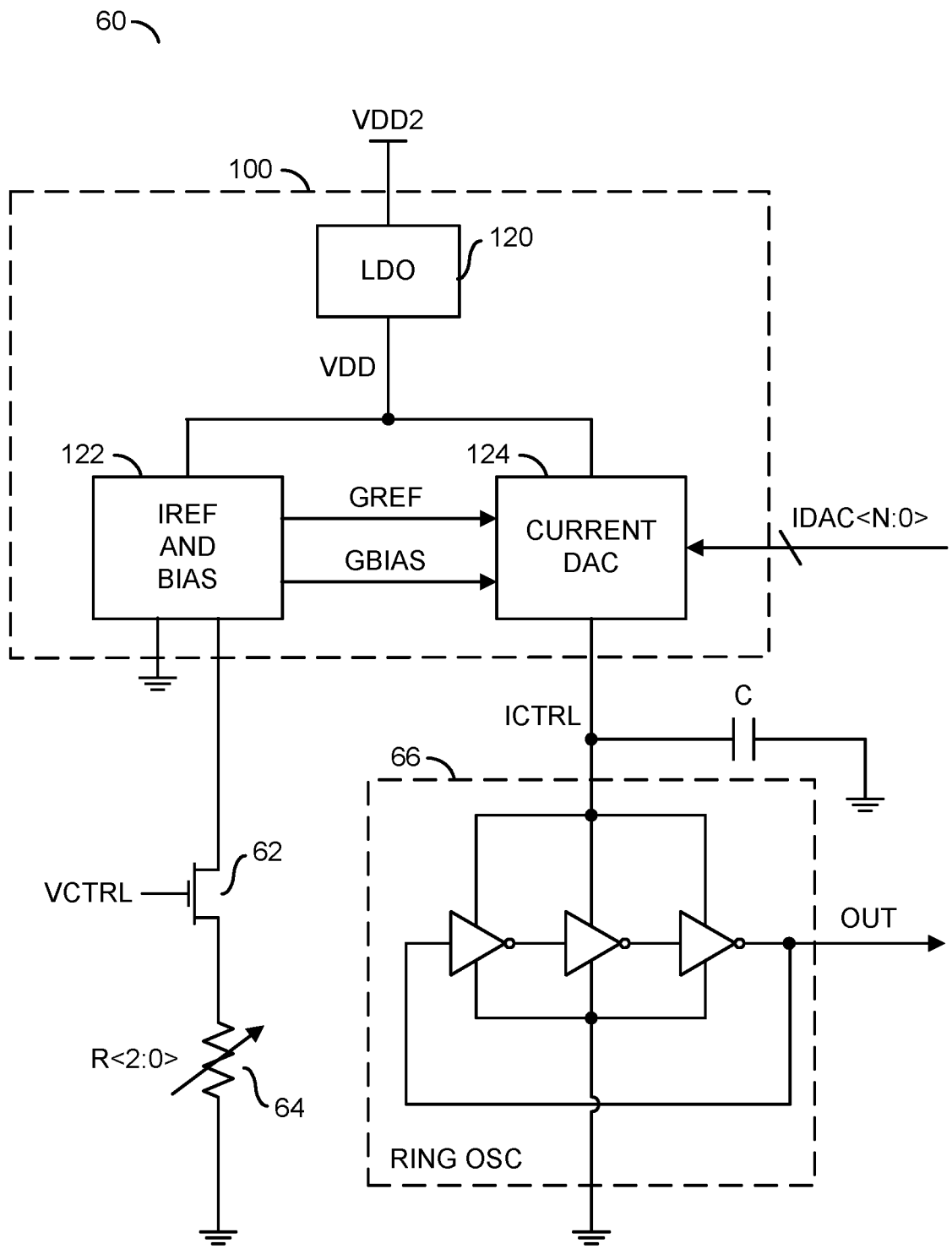
FIG. 3 is a diagram illustrating a voltage controlled oscillator in accordance with an embodiment of the invention.

Referring to FIG. 3, a diagram is shown illustrating a voltage controlled oscillator in accordance with an embodiment of the invention. In an example, the VCO 60 may comprise the circuit 100, a transistor 62, a programmable resistance 64, and a ring oscillator 66. The circuit 100 may comprise a block (or circuit) 120, a block (or circuit) 122, and a block (or circuit) 124. In an example, the transistor 62 may be implemented as an n-channel metal-oxide-semiconductor (NMOS) field effect transistor (FET). In an example, the programmable resistance 64 may be configured to be controlled by a three-bit digital signal (e.g., R<2:0>). In an example, the ring oscillator 66 may comprise an odd number of inverter circuits connected in a ring. In an example, the ring oscillator 66 may comprise three inverter circuits connected in a ring. The block 120 may be implemented as a regulator circuit. In an example, the block 120 may be implemented as a low drop out regulator (LDO). The block 122 may be implemented as a reference current and bias signal generating circuit. The block 124 may be implemented as a digitally programmable current source. In an example, the circuit 124 may be implemented as an n-bit current-steering digital-to-analog converter. In an example, the circuit 124 may be implemented as a 7-bit current-steering digital-to-analog converter.

In an example, the voltage supply VDD2 may be connected to an input of the regulator circuit 120. An output of the regulator circuit 120 may present a regulated supply voltage VDD. The regulator circuit 120 is generally configured to generate the regulated supply voltage VDD from the supply voltage VDD2. In various embodiments, the regulated supply voltage VDD has a level similar to the analog supply voltage AVDD. In an example, the supply voltage VDD2 may be implemented as twice the regulated supply voltage VDD (e.g., VDD2=2.4V for VDD=1.2V). The output of the regulator circuit 120 may be connected to a voltage supply input of the circuit 122 and a voltage supply input of the circuit 124. A first output of the circuit 122 may present a signal (e.g., GREF). A second output of the circuit 122 may present a signal (e.g., GBIAS). A third output of the circuit 122 may be connected to a drain terminal of the transistor 62. A source terminal of the transistor 62 may be connected to a first terminal of the programmable resistance 64. A second terminal of the programmable resistance 64 may be connected to a circuit ground potential. A second supply terminal of the circuit 122 may also be connected to the circuit ground potential. The signal VCTRL may be presented to a gate terminal of the transistor 62. The signals GREF and GBIAS may be generated by the circuit 122 in response to the supply voltage VDD based on the signal VCTRL and the signal R<2:0>.

The circuit 122 and the circuit 124 are generally connected to form a current mirror. The circuit 124 may have a first input that may receive the signal GREF, a second input that may receive the signal GBIAS, a third input that may receive the signal IDAC, and an output that may present a current signal (e.g., ICTRL). The circuit 124 is generally configured to generate the current signal ICTRL in response to the regulated supply voltage VDD, the signal GREF, the signal GBIAS, and the signal IDAC. In an example, the signal IDAC may be implemented as an n-bit digital control signal (e.g., IDAC<n:0>). In an example embodiment, the signal IDAC may be implemented as a 7-bit digital control signal (e.g., IDAC<6:0>). The circuit 124 is generally configured to generate the current signal ICTRL comprising a flexible current ratio 1:N following the control voltage current generated by the circuit 122 and communicated to the circuit 124 by the signal GREF and the signal GBIAS (e.g., ICTRL=N times the control voltage current). In an example, the circuit 124 may be configured to provide a maximum ratio of 3× between the current ICTRL and the control voltage current.

In an example, an output of the circuit 124 may be connected to a control current terminal of the ring VCO 66. A bypass capacitor C may be connected between the output of the circuit 124 and the circuit ground potential. The bypass capacitor C generally helps reduce noise on the signal ICTRL. The current ICTRL may be presented from the output of the circuit 124 to the control current terminal of the ring VCO 66. A second terminal of the ring VCO 66 may be connected to the circuit ground potential. The ring VCO 66 is generally configured to generate the signal OUT in response to the signal ICTRL.

Figure 4:
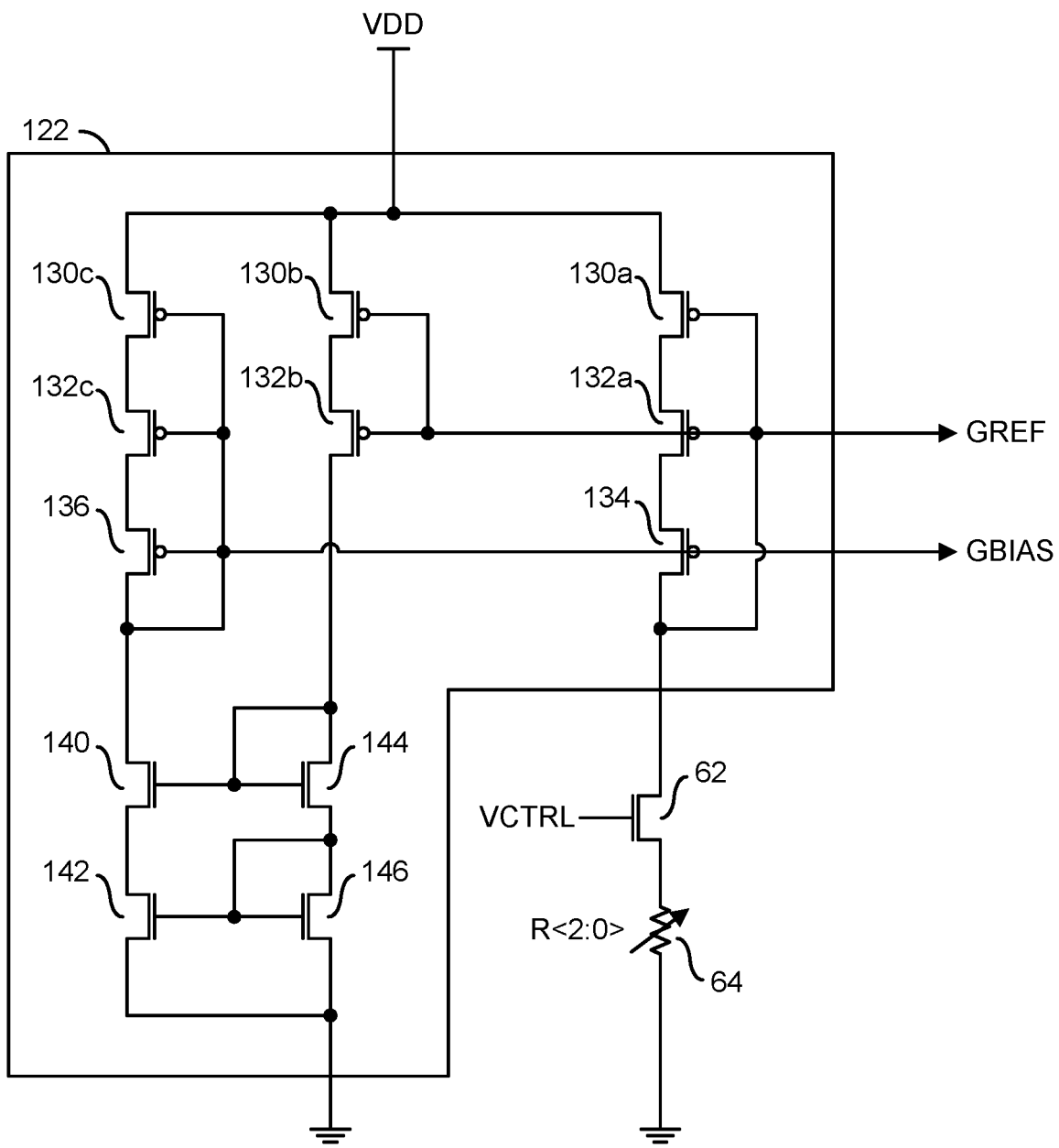
FIG. 4 is a diagram illustrating a current reference and bias voltage generating circuit in accordance with an embodiment of the invention.

Referring to FIG. 4, a diagram is shown illustrating an example implementation of the circuit 122 of FIG. 3. In an example, the circuit 122 may be configured to generate a control voltage current, the current mirror signal GREF, and the bias signal GBIAS. In an example, the circuit 122 may comprise a plurality of transistors 130a-130c, a plurality of transistors 132a-132c, a transistor 134, a transistor 136, a transistor 140, a transistor 142, a transistor 144, and a transistor 146. In an example, the transistors 130a-130c, 132a-132c, 134, and 136 may be implemented as PMOS FETs. In an example, the transistors 140, 142, 144, and 146 may be implemented as NMOS FETs.

In an example, source terminals of the transistors 130a-130c may be connected to the regulated supply voltage VDD. A drain terminal of each of the transistors 130a-130c may be connected to a source terminal of a respective one of transistors 132a-132c. A gate terminal of each of the transistors 130a-130c may be connected to a gate terminal of the respective one of the transistors 132a-132c. The gate terminals of the transistors 132a and 132b may also be connected to the first output of the circuit 122. The signal GREF may be presented at the gate terminal of the transistor 130a and to the output of the circuit 122. A drain terminal of the transistor 132a may be connected to a source terminal of the transistor 134. The gate terminal of the transistor 132a may be connected to a drain terminal of the transistor 134. A drain terminal of the transistor 132c may be connected to a source terminal of the transistor 136. The gate terminal of the transistor 132c may be connected to a gate terminal and a source terminal of the transistor 136. The drain terminal of the transistor 134 may be connected to the drain terminal of the transistor 62. A gate terminal of the transistor 134 may be connected to the gate terminal of the transistor 136 and the second output of the circuit 122. The drain terminal of the transistor 136 may be connected to a drain terminal of the transistor 140. The signal GBIAS may be presented at the gate terminal of the transistor 134 and to the second output of the circuit 122. A drain terminal of the transistor 132b may be connected to a drain terminal of the transistor 144, a gate terminal of the transistor 144, and a gate terminal of the transistor 140. A source terminal of the transistor 140 may be connected to a drain terminal of the transistor 142. A source terminal of the transistor 144 may be connected to a drain terminal of the transistor 146, a gate terminal of the transistor 146, and a gate terminal of the transistor 142. Source terminals of the transistors 142 and 146 may be connected to the circuit ground potential.

Figure 5:
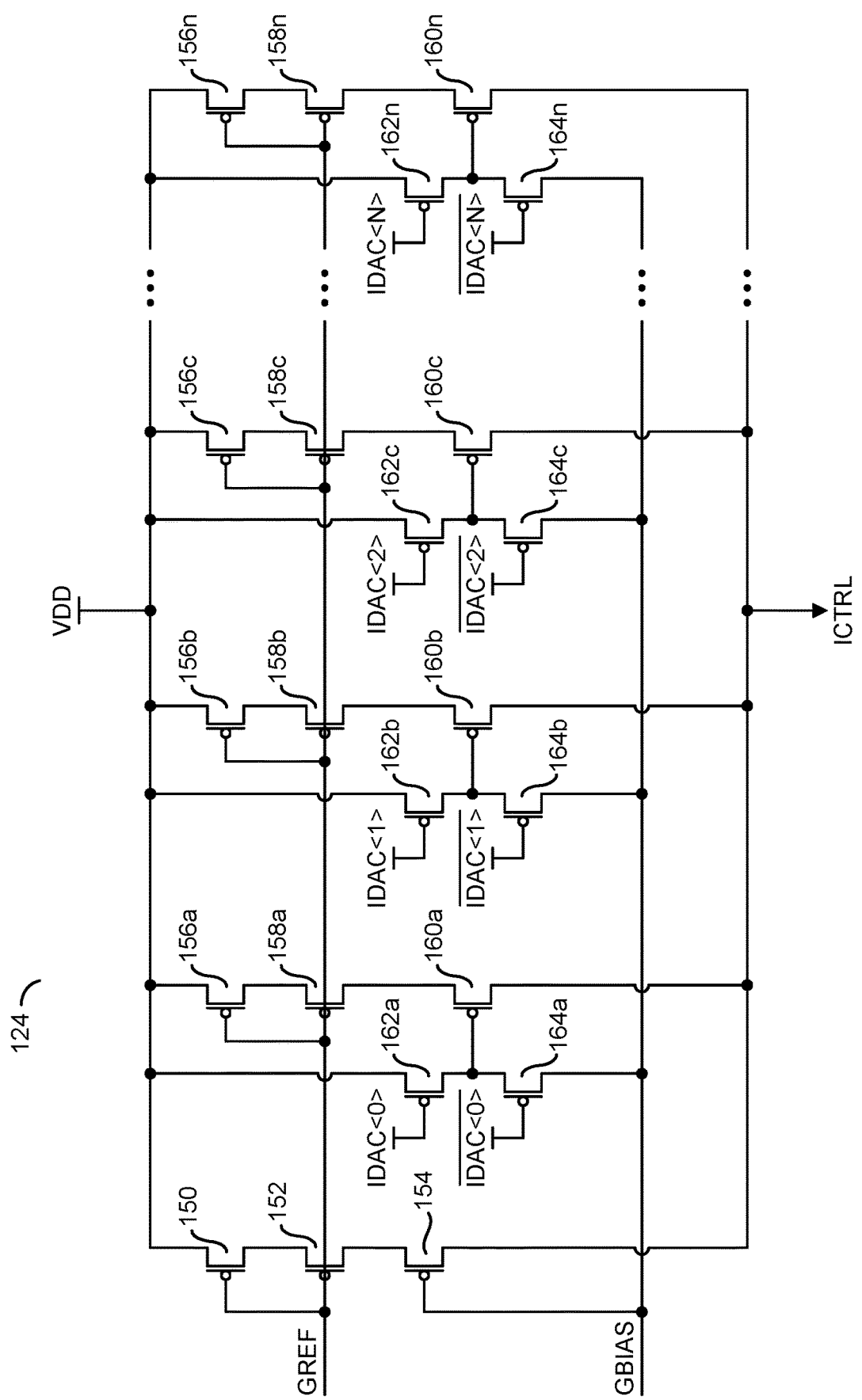
FIG. 5 is a diagram illustrating a current-steering digital-to-analog converter circuit in accordance with an embodiment of the invention.

Referring to FIG. 5, a diagram is shown illustrating an example implementation of the circuit 124 of FIG. 3. In an example, the circuit 124 may be implemented as an n-bit current-steering digital-to-analog converter. In an example, the circuit 124 may be implemented with seven bits to provide a flexible 1:n current ratio. In an example, the circuit 124 may provide the current ICTRL with a current ratio ranging from a minimum value needed to ensure the ring oscillator 66 oscillates (e.g., about 0.354×) to a maximum value of 3× following the control voltage current generated by the circuit 122.

In an example, the circuit 124 may comprise a transistor 150, a transistor 152, a transistor 154, a plurality of binary weighted transistors 156a-156n, a plurality of binary weighted transistors 158a-158n, a plurality of transistors 160a-160n, a plurality of transistors 162a-162n, and a plurality of transistors 164a-164n. In an example, the transistors 150, 152, 154, 156a-156n, 158a-158n, 160a-160n, 162a-162n, and 164a-164n may be implemented as PMOS FETs. In an example, the circuit 124 generally comprises a fixed current stage (e.g., comprising the transistors 150, 152, and 154) and a plurality of binary-weighted current stages (e.g., each comprising respective ones of the transistors 156a-156n, 158a-158n, 160a-160n, 162a-162n, and 164a-164n). Each of the plurality of binary-weighted current stages is generally configured to be controlled by a respective bit of the signal IDAC. In an example, the transistors 156a, 158a, 160a, 162a, and 164a may implement a least significant bit (LSB) stage and the transistors 156n, 158n, 160n, 162n, and 164n may implement a most significant bit (MSB) stage. In an example, the fixed current stage (e.g., comprising the transistors 150, 152, and 154) may be configured (sized) to generate a current that is approximately 0.354 times the control voltage current generated by the circuit 122 and each of the binary-weighted stages may be configured (sized) to generate respective currents which, when added together with the current of the fixed current stage approximately equal 3x the control voltage current generated by the circuit 122. In an example embodiment where the signal IDAC is implemented as a 7-bit signal and the control voltage current source of the circuit 122 is implemented comprising 288 fingers, the current sources of the stages of the circuit 124 may be implemented as summarized as in the following Table 1:

TABLE 1

| STAGE | FINGERS |
| --- | --- |
| Fixed current | 102 |
| IDAC<0> | 6 |
| IDAC<1> | 12 |
| IDAC<2> | 24 |
| IDAC<3> | 48 |
| IDAC<4> | 96 |
| IDAC<5> | 192 |
| IDAC<6> | 384 |

However, other numbers of fingers may be implemented to meet design criteria of a particular implementation.

In an example, a source terminal of the transistor 150, source terminals of the transistors 156a-156n, and source terminals of the transistors 162a-162n may be connected to the regulated supply voltage VDD. A drain terminal of the transistor 150 may be connected to a source terminal of the transistor 152. A gate terminal of the transistor 150 may be connected to a gate terminal of the transistor 152. A drain terminal of the transistor 152 may be connected to a source terminal of the transistor 154. The signal GBIAS may be presented to a gate terminal of the transistor 154.

A drain terminal of each of the transistors 156a-156n may be connected to a source terminal of a respective one of transistors 158a-158n. A gate terminal of each of the transistors 156a-156n may be connected to a gate terminal of the respective one of transistors 158a-158n. The signal GREF may be presented to the gate terminals of the transistors 150, 152, 156a-156n, and 158a-158n. A drain terminal of each of the transistors 158a-158n may be connected to a source terminal of a respective one of transistors 160a-160n. A source terminal of each of the transistors 154 and 160a-160n may be connected together to form a node at which the signal ICTRL may be presented.

A drain terminal of each of the transistors 162a-162n may be connected to a source terminal of a respective one of transistors 164a-164n and a gate terminal of a respective one of transistors 160a-160n. A drain terminal of each of the transistors 164a-164n may be connected together with the gate terminal of the transistor 154 to form a node to receive the signal GBIAS. A gate terminal of each of the transistors 162a-162n may be connected to receive a respective bit (e.g., IDAC<0>, IDAC<1>, . . . , IDAC<n>) of the signal IDAC. A gate terminal of each of the transistors 164a-164n may be connected to receive a complement of the respective bit (e.g., IDAC<0>, IDAC<1>, . . . , IDAC<n>) of the signal IDAC. The use of the transistors 162a-162n and 164a-164n, and the bias signal GBIAS generally ensure that the transistors 160a-160n may be fully turned ON or fully turned OFF based on the value of the respective bit of the signal IDAC. In an example, a fanout of the signal IDAC may be increased and the complement of the signal IDAC may be generated using a plurality of inverter circuits connected in series.

Figure 6:
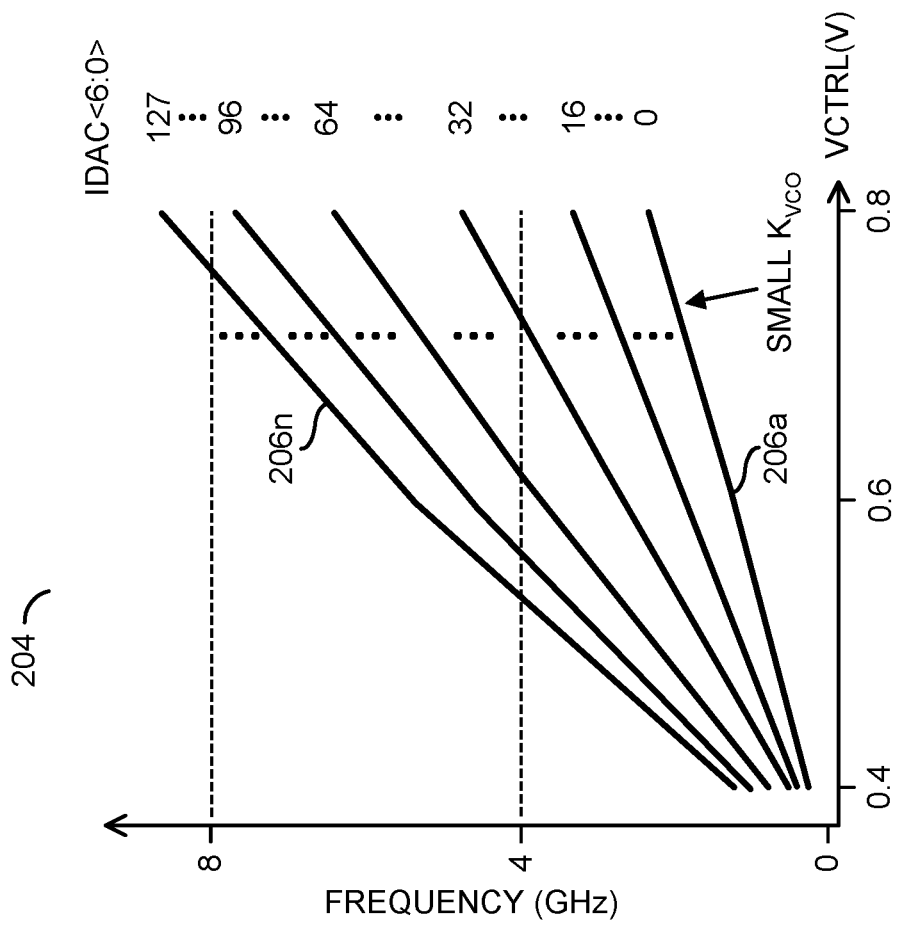
FIG. 6 is a diagram illustrating a technique for changing a gain of a voltage controlled oscillator in accordance with an embodiment of the invention.
Figure 6:
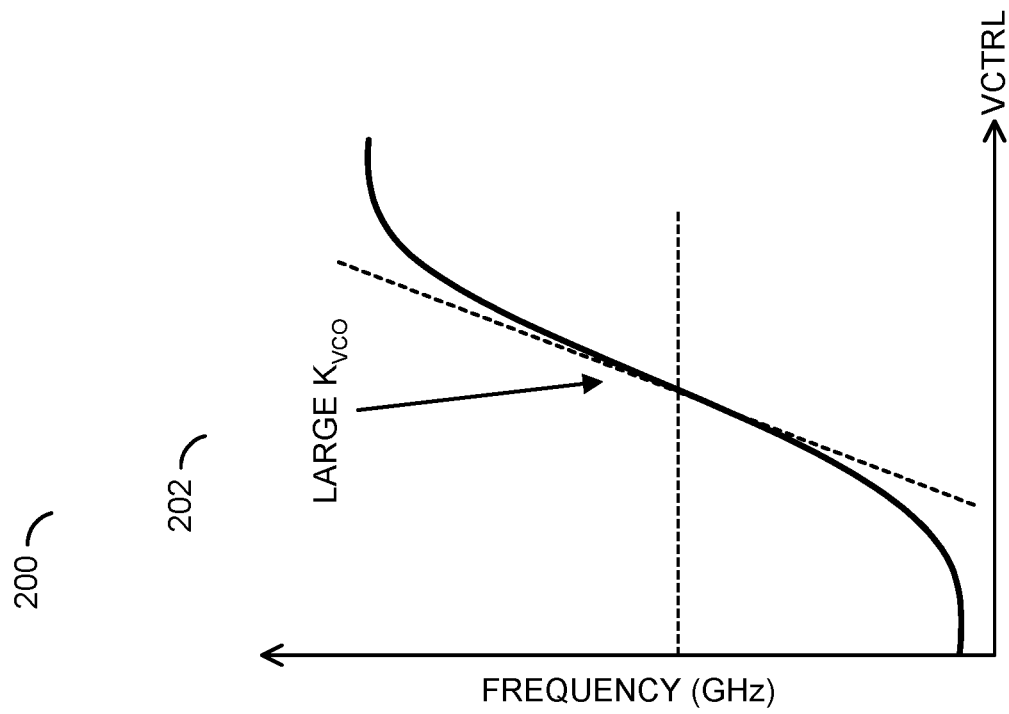

Referring to FIG. 6, a diagram 200 is shown illustrating a method of using multiple overlapped tuning sub-bands to reduce a gain of a voltage controlled oscillator in accordance with an embodiment of the invention. In many applications, PLLs are implemented with wide tuning ranges in order to cover desired operating frequency bands and to accommodate process, voltage, and temperature (PVT) variations. As the operating frequencies of the PLLs increase while the supply voltages scale down with advanced CMOS technologies, the voltage-controlled oscillator (VCO) tuning gain (Kvco, expressed in GHz/V) increases considerably. A graph 202 is shown (not to scale) generally illustrating a conventional PLL tuning curve. In conventional PLLs, a large tuning gain Kvco is needed to cover a desired frequency range (e.g. 4 GHz to 8 GHz) while operating with a smaller control voltage. A large Kvco may degrade PLL phase noise and spur performance severely.

A graph 204 is shown illustrating PLL tuning gains of multiple overlapped tuning sub-bands in accordance with an embodiment of the invention. The graph 204 illustrates overlapped tuning sub-bands for a ring VCO with a regulated supply voltage of 1.2 Volts (V). In various embodiments, the disadvantages of the large VCO gain may be addressed by employing multiple overlapped tuning sub-bands 206a-206n to cover the desired frequency range, instead of using just a single tuning curve. In various embodiments, an IDAC current may be implemented to select among desired tuning sub-bands 206a-206n. In an example, a seven bit IDAC current (e.g., IDAC<6:0>) may be implemented to provide 127 sub-bands. Such topology may achieve low VCO gain while still covering a wide frequency tuning range. As illustrated by the graph 204, a range of VCO gains may be provided for generating a 4 GHz-8 GHz VCO frequency depending on the value of IDAC. In an example, a large VCO gain similar to the graph 202 may be obtained when the IDAC value is high (e.g., curve 206n). Calibration may adjust the IDAC value to an optimal value with smaller VCO gains, and larger VCTRL dynamic range/margin for temperature and voltage shift.

Figure 7:
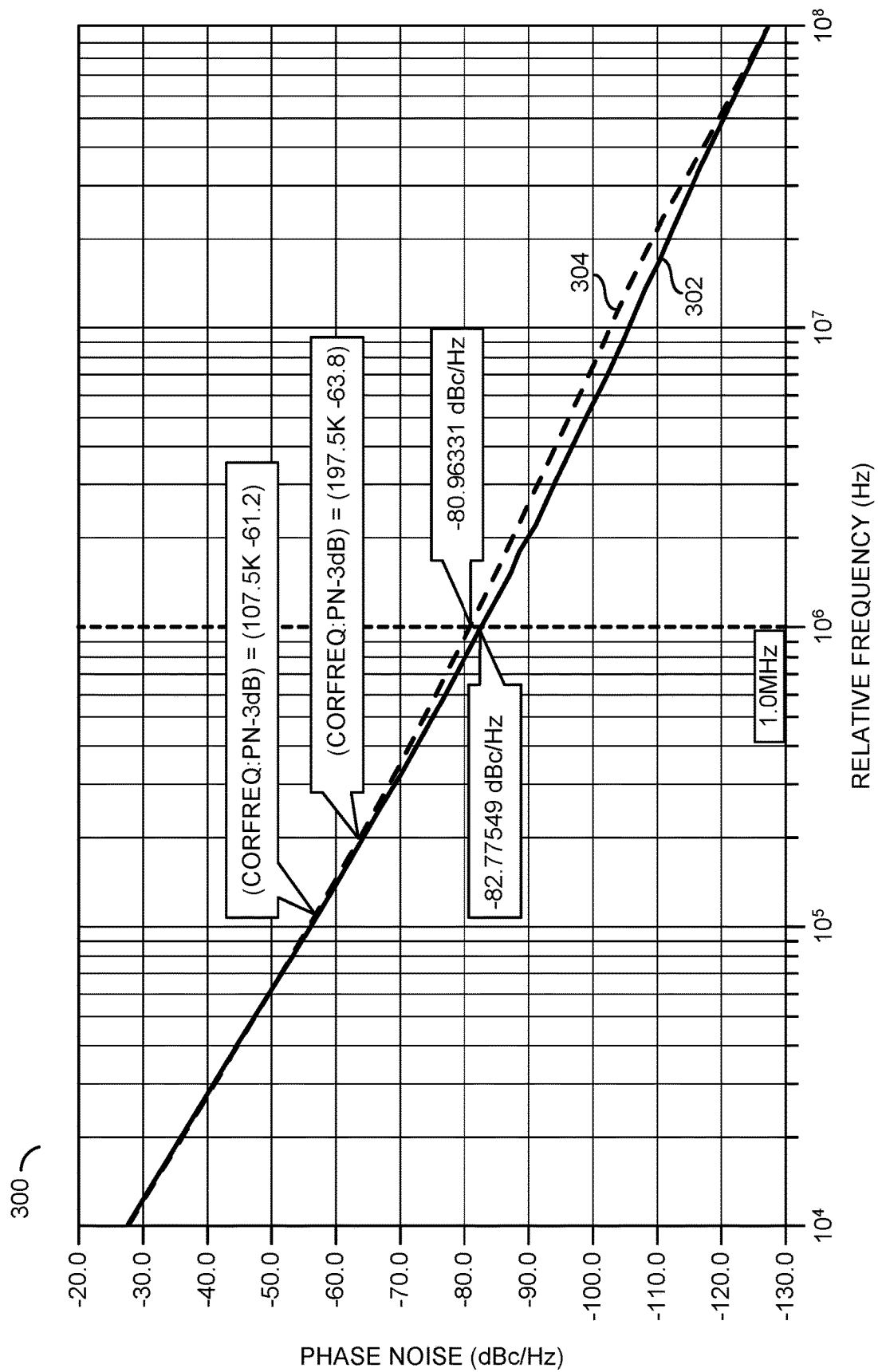
FIG. 7 is a diagram illustrating a simulation result of a voltage controlled oscillator in accordance with an embodiment of the invention.

Referring to FIG. 7, a diagram is shown illustrating a simulation result of a voltage controlled oscillator in accordance with an embodiment of the invention. The simulation shown is for a VCO frequency of 5 GHz. In an example, a graph 300 illustrates a simulation result for phase noise of the circuit 60 of FIG. 3 (e.g., shown by a solid line 302) and a VCO structure including an external bandgap reference and bias circuit (e.g., shown by a dashed line 304). The simulation result illustrates the circuit 60 having a phase noise of −82.77549 dBc/Hz and a 3 dB down corner frequency=(107.5K–61.2), while the VCO structure including the external bandgap reference and bias circuit has a phase noise of −80.96331 dBc/Hz and a 3 dB down corner frequency=(197.5K–63.8). The VCO structure including the external bandgap reference and bias circuit generally suffers from injected device noise from the external bandgap reference and bias circuit as well as supply noise.

As may be seen by comparing the curves 302 and 304, the VCO phase noise of the circuit 60 is better than the VCO structure including the external bandgap reference and bias circuit. The VCO phase noise of the circuit 60 with a 7-bit IDAC<6:0>=127 is generally similar to a 1:3 fixed current ratio VCO without VCO calibration, but has a smaller VCO gain than the 1:3 fixed current ratio VCO with no VCO calibration. The smaller VCO gain results in less loop jitter. The control voltage of the circuit 60 stays around half of a supply voltage, while the 1:3 fixed current ratio VCO has a control voltage that varies widely over variation in PVT.

Figure 8:
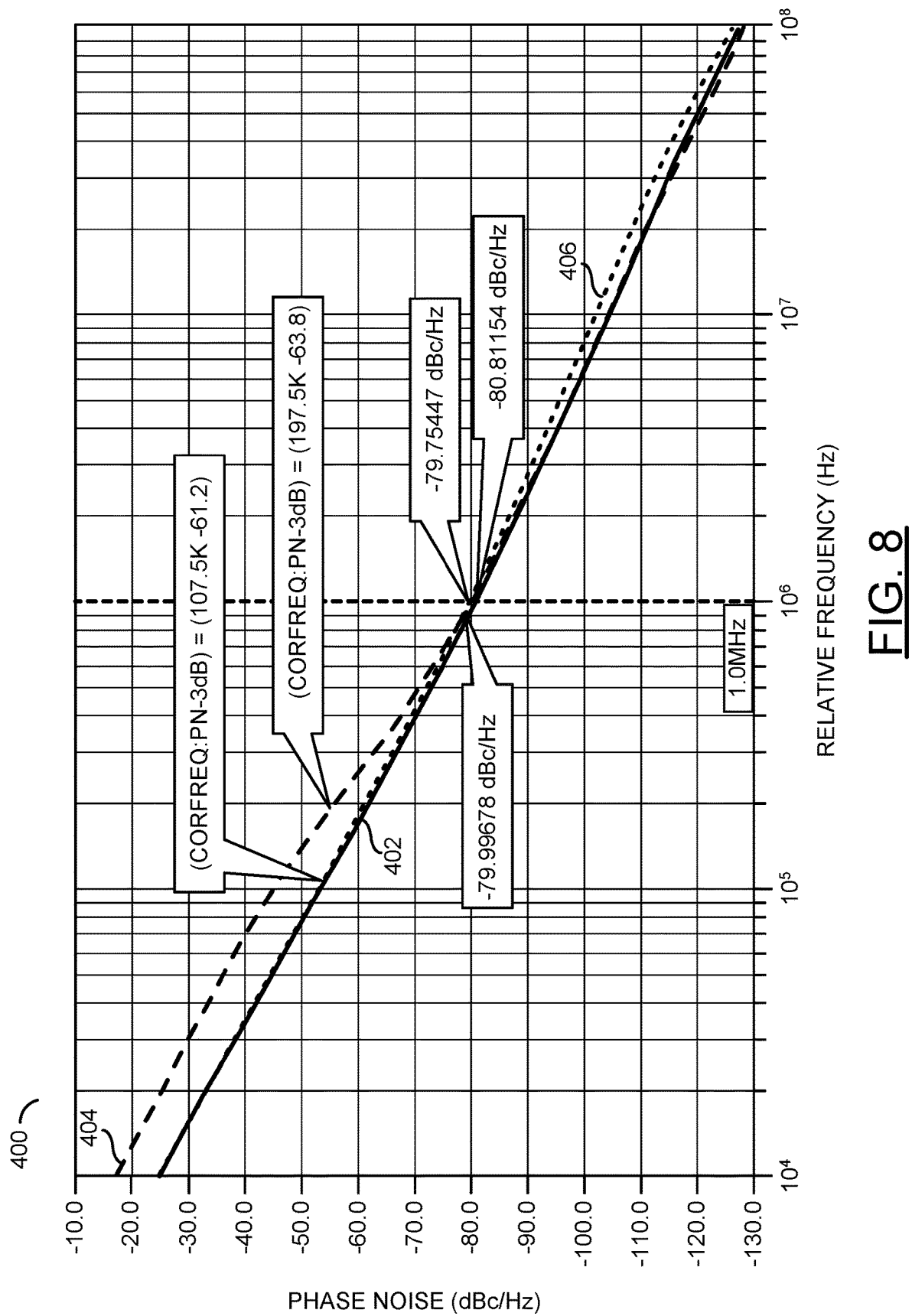
FIG. 8 is a diagram illustrating a simulation result of a voltage controlled oscillator in accordance with an embodiment of the invention.

Referring to FIG. 8, a diagram is shown illustrating a simulation result of a voltage controlled oscillator in accordance with an embodiment of the invention. The simulation shown is for a VCO frequency of 8 GHz. In an example, a graph 400 illustrates a simulation result for phase noise of the circuit 60 of FIG. 3 (e.g., shown by a solid line 402), the VCO structure including the external bandgap reference and bias circuit (e.g., shown by a long-dashed line 404), and a VCO structure with a fixed 1:3 current ratio (e.g., shown by a short dashed line 406). The simulation result illustrates the circuit 60 having a phase noise of −80.81154 dBc/Hz and a 3 dB down corner frequency=(107.5K–61.2), while the fixed ratio VCO structure has a phase noise of −79.75447 dBc/Hz and a 3 dB down corner frequency=(107.5K–61.2), and the VCO structure including the external bandgap reference and bias circuit has a phase noise of −79.99678 dBc/Hz and a 3 dB down corner frequency=(197.5K–63.8). The VCO structure including the external bandgap reference and bias circuit generally suffers from injected device noise from the external bandgap reference and bias circuit as well as supply noise.

As may be seen by comparing the curves 402, 404, and 406, the VCO phase noise of the circuit 60 is better than a VCO structure including an external bandgap reference and bias circuit. The VCO phase noise of the circuit 60 with IDAC<6:0>=127 is generally similar to the 1:3 fixed current ratio VCO without VCO calibration, but has a smaller VCO gain than the 1:3 fixed current ratio VCO with no VCO calibration. The smaller VCO gain results in less loop jitter. The control voltage of the circuit 60 stays around half of a supply voltage, while the 1:3 fixed current ratio VCO has a control voltage that varies widely over variation in PVT.

Figure 9:
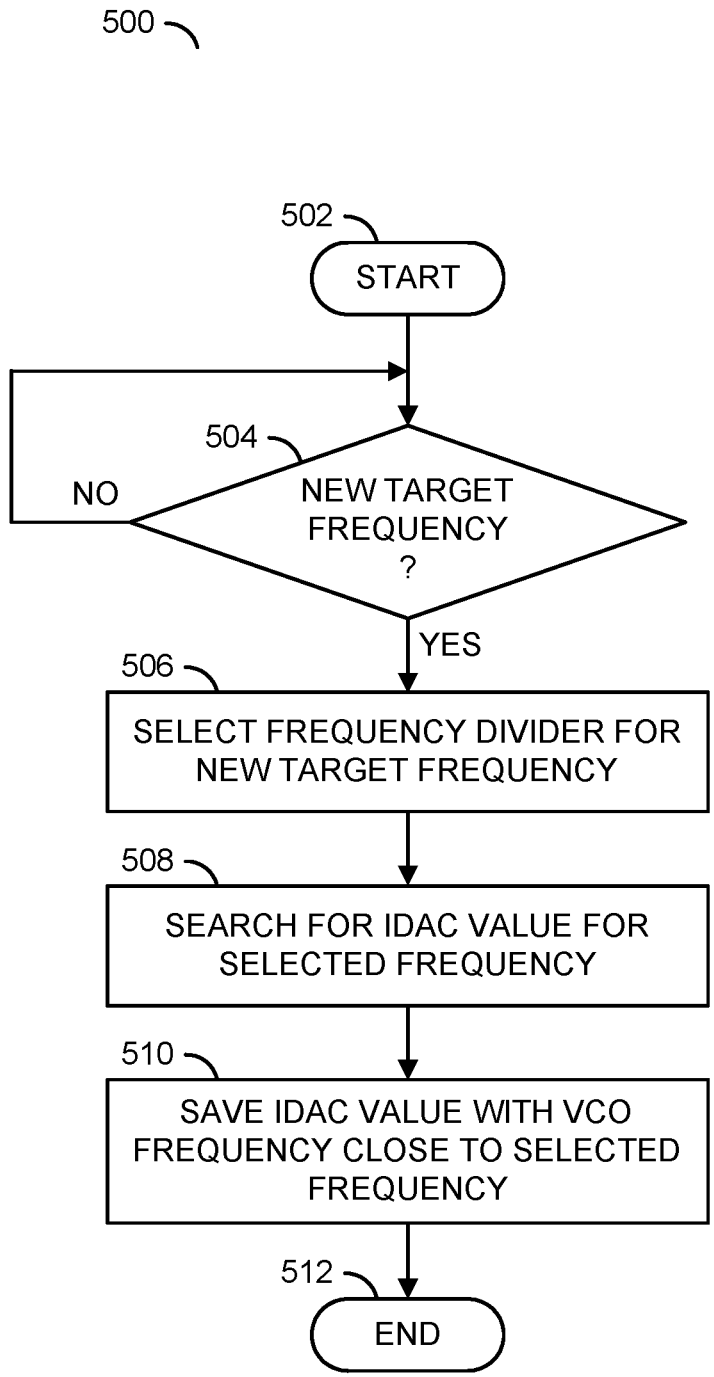
FIG. 9 is a diagram illustrating a frequency adjustment process in accordance with an embodiment of the invention.

Referring to FIG. 9, a diagram is shown illustrating a frequency adjustment process in accordance with an embodiment of the invention. In an example, a method (or process) 500 may implement the frequency adjustment process in accordance with an embodiment of the invention. In an example, the method 500 may comprise a step (or state) 502, a decision step (or state) 504, a step (or state) 506, a step (or state) 508, a step (or state) 510, and a step (or state) 512. The method 500 may begin in the step 502 and move to the decision step 504. In the decision step 504, the method 500 may determine whether a new target frequency has been requested. In an example, a new target frequency may be requested in response to the frequency of the input signal IN being changed to a new reference frequency and/or a new target frequency value (e.g., CNT_TRGT) being set (e.g., externally). When a new target frequency has not been requested, the method 500 may loop in the step 504. When a new target frequency has been requested, the method 500 may move to the step 506.

In the step 506, the method 500 may begin configuring the PLL 50 for the next target frequency by changing the frequency divider 56, the divider 114, and/or the divider 116 to new values. In an example, the new values may be selected from a predefined lookup table. The method 500 may then move to the step 508. In the step 508, the method 500 may search for an IDAC value that provides the selected new frequency. When the IDAC value that provides a VCO frequency within a predefined range of the selected new frequency is found, the method 500 may move to the step 510. In an example, the IDAC value may be selected based on a binary search strategy configured to set each bit of the IDAC value using a number of calibration cycle iterations. In the step 510, the method 500 may save the IDAC value that has been found to provide the VCO frequency within the threshold value of the selected frequency. In an example, the IDAC value may be saved in a latch, a register, or a configuration memory.

Figure 10:
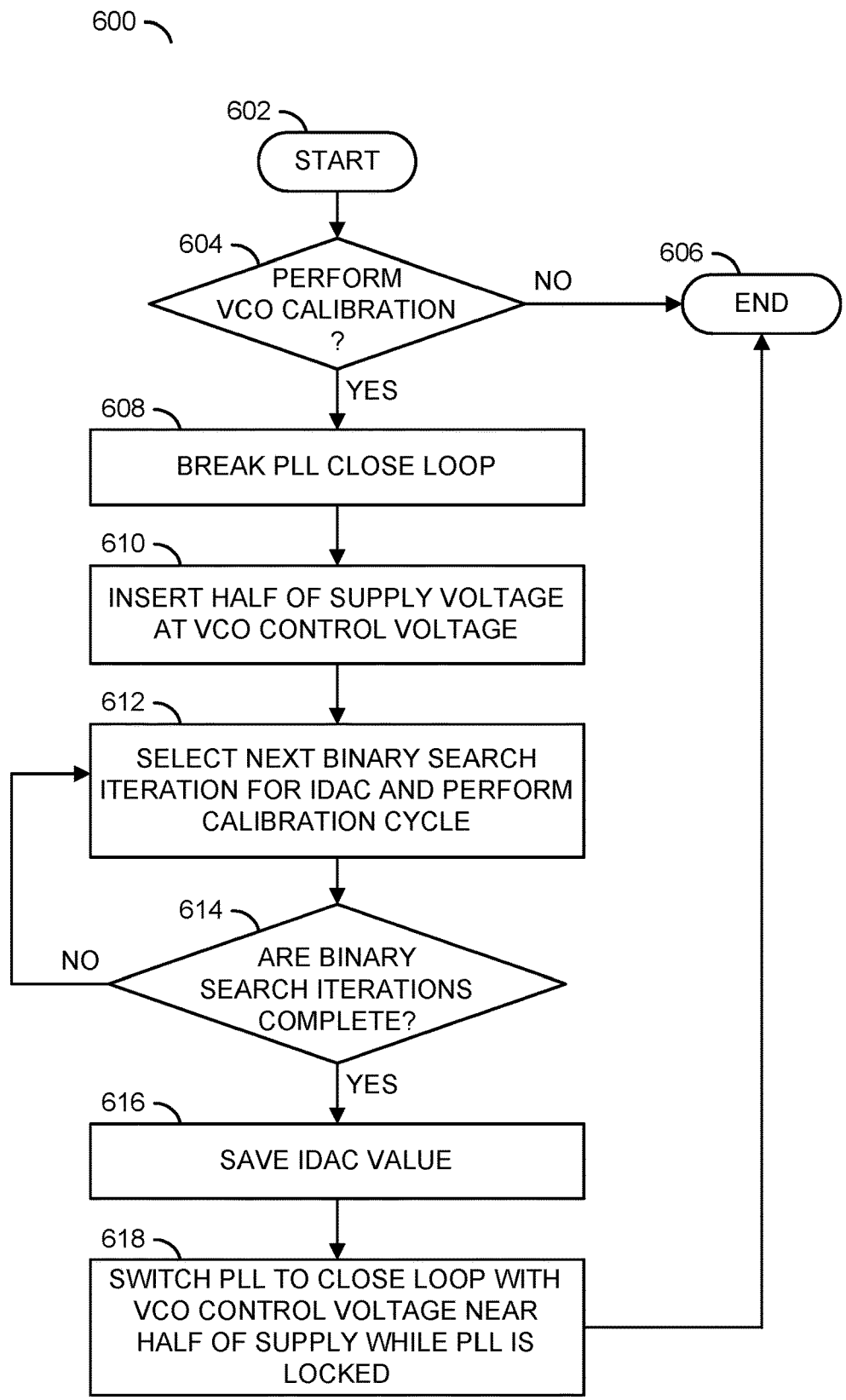
FIG. 10 is a diagram illustrating a calibration process in accordance with an embodiment of the invention.

Referring to FIG. 10, a diagram is shown illustrating a calibration process in accordance with an embodiment of the invention. In an example, a method (or process) 600 may implement the calibration process in accordance with an embodiment of the invention. In an example, the method 600 may comprise a step (or state) 602, a decision step (or state) 604, a step (or state) 606, a step (or state) 608, a step (or state) 610, a step (or state) 612, a decision step (or state) 614, a step (or state) 616, and a step (or state) 618. The method 600 may begin in the step 602 and move to the decision step 604. In the decision step 604, the method 600 may determine whether VCO calibration is to be performed. When VCO calibration is not to be performed, the method 600 may move to the step 606 and terminate. When VCO calibration is to be performed, the method 600 may move to the step 608.

In the step 608, the method 600 may begin the calibration process by breaking (interrupting) the closed loop operation of the PLL 50. In an example, the method 600 may break the closed loop operation by disabling the charge pump circuit 54. In an example, the charge pump circuit 54 may be disabled by de-asserting the signal EN_CP. The method 600 may then move to the step 610. In the step 610, the method 600 may present a reference voltage (e.g., VREF) as the signal VCTRL at the control input of the VCO 60. In an example, the method 600 may control the switch circuit 104 (e.g., using the signal CAL) to pull up the input of the loop filter 56 to the reference voltage VREF. In an example, the reference voltage VREF may be set having a voltage level that is half of the internal regulated supply voltage VDD of the VCO 60. The method 600 may then move to the step 612.

In the step 612, the method 600 selects a next value for the signal IDAC utilizing a binary search strategy. After setting the signal IDAC to the next value, the method 600 may perform a calibration cycle iteration, and then move to the step 614. In the step 614, the method checks whether the number of iterations of the binary search strategy are completed. When the number of iterations of the binary search strategy are not completed, the method 600 may return to the step 612. When the number of iterations of the binary search strategy are completed, the method 600 may move to the step 616.

In the step 616, the method 600 may save the value of the signal IDAC. In an example, the value of the signal IDAC may be saved in a latch, in a register, or in a location in a configuration memory. The method 600 may then move to the step 618. In the step 618, the method 600 may switch the PLL 50 back to closed loop operation with the VCO control voltage VCTRL near half of the internal regulated supply voltage VDD while the PLL is locked. The method 600 may then move to the step 606 and terminate.

The functions performed by the diagrams of FIGS. 1-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The various signals of the present invention are generally "asserted" (e.g., a digital HIGH, or 1) or "un-asserted" (e.g., a digital LOW, or 0). However, the particular polarities of the asserted (e.g., on) and un-asserted (e.g., off) states of the signals may be adjusted (e.g., reversed) to meet the design criteria of a particular implementation. Additionally, inverters may be added to change a particular polarity of the signals.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
   a first circuit configured to generate an output signal having a first frequency in response to a voltage level of a first input signal and a value of a second input signal; and
   a second circuit configured to perform a calibration operation to determine the value of the second input signal by (i) setting the voltage level of the first input signal to a reference voltage level and (ii) adjusting the value of the second input signal based on a reference frequency signal having a second frequency, said output signal having the first frequency, and a value of a third input signal representing a target frequency for said put signal.

2. The apparatus according to claim 1, wherein said first circuit comprises a voltage controlled oscillator configured to generate said output signal in response to said voltage level of said first input signal and said value of said second input signal.

3. The apparatus according to claim 2, wherein said voltage controlled oscillator comprises:
   a third circuit having a first input connected to a supply voltage and a first output presenting a regulated supply voltage to a node, wherein said third circuit is configured to generate said regulated supply voltage at said node in response to said supply voltage;
a fourth circuit connected to said node and configured to generate a reference signal and a bias signal in response to a reference current; and
a fifth circuit having a second input connected to said node, a third input receiving said reference signal from said fourth circuit, a fourth input receiving said bias signal from said fourth circuit, a fifth input receiving said second input signal, and a second output presenting a control current to a ring oscillator, wherein
   (i) sit said third circuit is configured to filter out noise of said supply voltage,
   (ii) said fourth circuit forms a current mirror with said fifth circuit,
   (iii) a transistor connected to said fourth circuit sets said reference current of said fourth circuit based on said voltage level of said first input signal,
   (iv) said fifth circuit is configured to provide a programmable current ratio for said current mirror based on said value of said second input signal, and
   (v) said voltage level of said first input signal is set to about half of said regulated supply voltage when said second circuit performs said calibration operation to select said value of said second input signal.

4. The apparatus according to claim 3, wherein operating conditions comprise process, voltage, and temperature (PVT), and said programmable current ratio is selected to optimize a voltage controlled oscillator tuning gain of said apparatus over variation in PVT.

5. The apparatus according to claim wherein said voltage controlled oscillator tuning gain of said apparatus is optimized to minimize an amount of litter.

6. The apparatus according to claim 4, farther comprising:
a charge pump circuit; and
a loop filter circuit coupled to said charge pump circuit, wherein, during an operating mode, said loop filter is configured to generate said first input signal based on a charge pump output of said charge pump circuit and, during said calibration operation, said loop filter is decoupled from said charge pump circuit and said voltage level of said first input signal is set to about half of said regulated supply voltage, which reduces a current mismatch of said charge pump output of said charge pump circuit.

7. The apparatus according to claim 6, wherein reducing said current mismatch reduces a reference spur.

8. The apparatus according to claim 4, wherein said third circuit comprises a low crop-out regulator.

9. The apparatus according to claim 1, wherein said first circuit and said second circuit are implemented as components of a phase-locked loop.

10. The apparatus according to claim 9, wherein said phase-locked loop is configured to operate over frequencies from about 4 GHz to about 8 GHz.

11. The apparatus according to claim 9, wherein said phase-locked loop is implemented in double-data rate (DDR) random access memory.

12. The apparatus according to claim 9, wherein said second circuit comprises:
a counter circuit configured to generate a count value based on said first frequency of said output signal and said second frequency of said reference frequency signal; and
a logic circuit configured to select the value of said second input signal based on said count value and said value of said third input signal representing said target frequency for said output signal.

13. The apparatus according to claim 12, wherein said logic circuit is configured to interrupt a closed loop operation of said phase-locked loop and connect said reference voltage level, in place of a charge pump output of a charge pump circuit of said phase-locked loop, to an input of a loop filter of said phase-locked loop to set said voltage level of said first input signal to said reference voltage level during said calibration operation.

14. The apparatus according to claim 13, wherein said calibration operation comprises performing a search for said value of said second input signal until said first frequency of said output signal matches said target frequency.

15. The apparatus according to claim 14, wherein said search comprises a binary search.

16. The apparatus according to claim 14, wherein said second circuit is configured to store said value of said second input signal that corresponds to said first frequency matching said target frequency.

17. The apparatus according to claim 16, wherein said value of said second input signal determined during said calibration operation is used while said phase-locked loop is in said closed loop operation to enable said first input signal to be about half of a regulated supply voltage of said first circuit when said phase-locked loop is locked.

18. The apparatus according to claim 14, wherein a frequency divider of said phase-locked loop is used as part of said counter circuit to compare said first frequency of said output signal with said second frequency of said reference frequency signal.

19. A method of jitter and reference spur management with adaptive gain by voltage controlled oscillator calibration comprising:
setting a voltage level of a first input signal of voltage controlled oscillator to a reference voltage, wherein said voltage controlled oscillator is configured to generate an output signal having a first frequency in response to said voltage level of the first input signal and a value of a second input signal; and
determining the value of the second input signal by performing a calibration operation comprising adjusting the value of the second input signal based on a reference frequency signal having a second frequency, said output signal having the first frequency, and a value of a third input signal representing a target frequency for said output signal.

20. The method according to claim 19, wherein determining the value of the second input signal comprises performing a binary search on the value of the second input signal using a plurality of calibration cycle iterations.

* * * * *